(12) United States Patent
Kundu (10) Patent No.: US 6,912,701 B2
(45) Date of Patent: Jun. 28, 2005

(54) METHOD AND APPARATUS FOR POWER SUPPLY NOISE MODELING AND TEST PATTERN DEVELOPMENT

(75) Inventor: Sandip Kundu, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 530 days.

(21) Appl. No.: 10/185,866

(22) Filed: Jun. 26, 2002

(65) Prior Publication Data

US 2004/0088615 A1 May 6, 2004

(51) Int. Cl.$^7$ ............................................. G06F 17/50
(52) U.S. Cl. ................... 716/5; 716/4; 716/6
(58) Field of Search ........................................ 716/4–6

(56) References Cited

U.S. PATENT DOCUMENTS

| 5,546,408 A |   | 8/1996 | Keller |         |
|-------------|---|--------|--------|---------|
| 5,642,296 A | * | 6/1997 | Saxena | 702/84  |
| 6,772,402 B2| * | 8/2004 | Mortensen | 716/6 |

FOREIGN PATENT DOCUMENTS

JP        11154709 A  *  6/1999   ........... H01L/21/82

OTHER PUBLICATIONS

Shepard, K.L.; Narayanan, V.; Noise in deep submicron digital design; Computer–Aided Design, 1996. ICCAD–96. Digest of Technical Papers., 1996 IEEE/ACM International Conference on , Nov. 10–14, 1996; pp.: 524–531.*

A. Deutsch et al.; Frequency–dependent crosstalk simulation for on–chip interconnections; Advanced Packaging, IEEE Transactions on; ,vol. 22, Issue 3 , Aug. 1999, pp.: 292–308.*

Chen, H. et al.; Interconnect and circuit modeling techniques for full–chip power supply noise analysis; Components, Packaging, and Manufacturing Technology, Part B: Advanced Packaging, IEEE Transactions on; vol. 21, Issue. 3, Aug. 1998, pp. 209–215.*

K. Lee et al.; Modeling and analysis of multichip module power supply planes; Components, Packaging, and Manufacturing Technology, Part B: Advanced Packaging, IEEE Transactions on; vol. 18, Issue 4, Nov. 1995, pp. 628–639.*

* cited by examiner

*Primary Examiner*—R. Stephen Dildine
(74) *Attorney, Agent, or Firm*—Cynthia T. Faatz (57) ABSTRACT

An approach for power supply noise modeling for test pattern development. For one aspect, conditions that may result in power supply noise-related failures are identified and the resulting faults are ranked.

25 Claims, 5 Drawing Sheets

METHOD AND APPARATUS FOR POWER SUPPLY NOISE MODELING AND TEST PATTERN DEVELOPMENT

BACKGROUND

1. Field

An embodiment of the present invention relates to the field of integrated circuit testing and more particularly, to integrated circuit power supply noise modeling, simulation, and test pattern development.

2. Discussion of Related Art

With the increasing complexity and integration levels of integrated circuit devices, managing power dissipation while achieving high performance levels is an increasingly difficult challenge.

In this environment, with smaller dimensions, tight design windows and tight timing constraints, any variations in the power supply can be detrimental to the performance and/or functionality of an integrated circuit device. For example, where a lead integrated circuit product is first designed for a first process and then moved to a new, smaller geometry process, such issues may be even more pronounced. When moving an integrated circuit product to a smaller process, it is frequently the practice that major portions of the chip are not redesigned. Thus, for example, with the smaller geometry process, power supply lines become narrower, but there may not be a commensurate reduction in current demand. With variations in the power supply, some devices may be starved for power creating a speed path or malfunction.

Such power supply noise-related failures may be difficult to model, simulate and/or identify during testing using prior analysis and test tools.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for power supply noise modeling is described. In the following description, particular types of software modules, development tools, computer systems and integrated circuits are described for purposes of illustration. It will be appreciated, however, that other embodiments are applicable to other types of software modules, development tools, computer systems and/or integrated circuits configured in another manner.

In accordance with one embodiment, in response to receiving input data related to an integrated circuit design, potential power supply noise-related faults/failures are fault-modeled and identified and may then be ranked.

Figure 1:
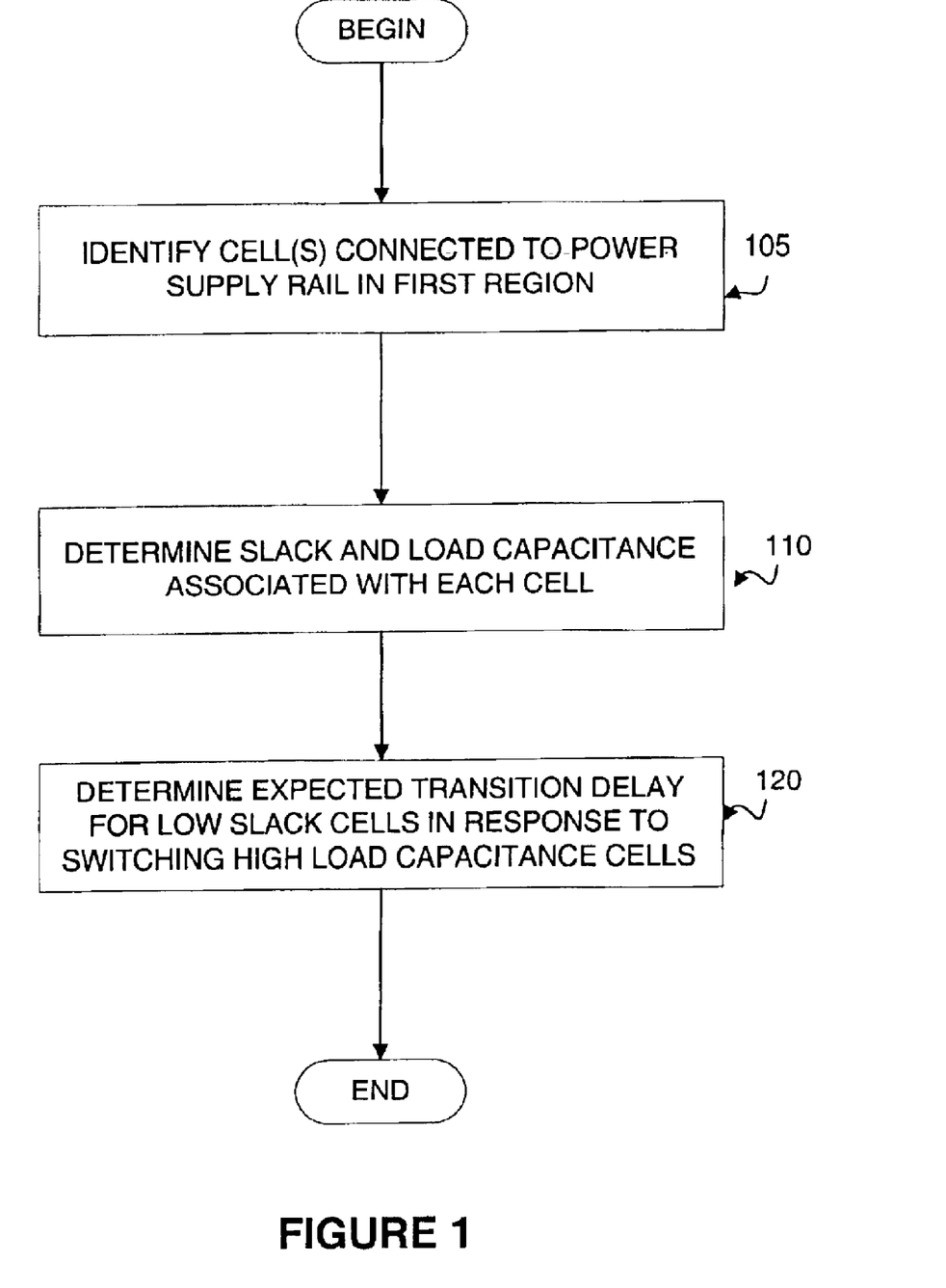
FIG. 1 is a flow diagram showing a power supply noise modeling method of one embodiment.

In particular, for one embodiment, as shown in FIG. 1, an approach for power supply noise modeling includes, at block 105, identifying, from an integrated circuit schematic or other associated input data, one or more cells that are connected to a specific power supply rail in a first region. Then, at block 110, slack and load capacitance associated with each cell identified at block 105 are determined. Slack, as the term is used herein, refers to the transition delay margin associated with a particular cell. For example, low slack cells have little margin and a low tolerance for timing variations without a resulting performance issue or malfunction. At block 120, the cells are ranked in terms of slack and load capacitance and at block 125, high load capacitance cells and low slack cells are identified.

Using this approach, the conditions that cause power supply noise-related issues can be identified and corresponding test vectors generated such that power supply noise-related failures can be more reliably detected. In some cases, an output of this process may even be used to change the physical design of an integrated circuit to address power supply-related issues.

Additional details of this and other embodiments are provided in the description that follows.

Figure 2:
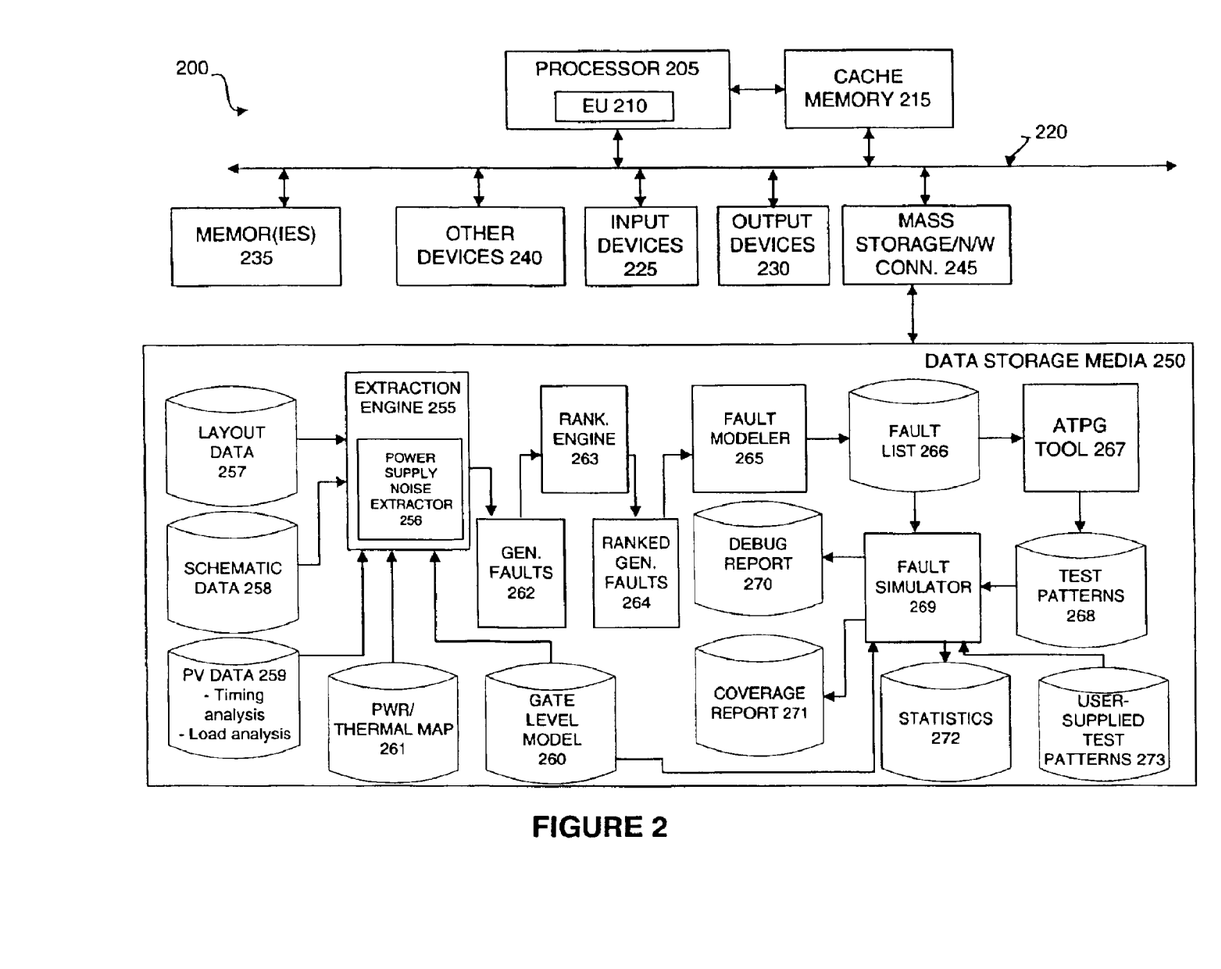
FIG. 2 is block diagram showing an exemplary computer system that may advantageously use the power supply noise modeling and test pattern development approach of one embodiment.

FIG. 2 is a block diagram of a computer system 200 in which the power supply noise modeling and test pattern development method and apparatus of one embodiment may be advantageously implemented. For this embodiment, the computer system 200 is may be a personal computer system running one of a LINUX or Windows™ operating system. (Windows operating systems are available from Microsoft Corporation of Redmond, Wash.) Other types of computers and/or computer systems and/or computer systems running other types of operating systems are within the scope of various embodiments.

The computer system 200 includes a processor 205 to execute instructions using an execution unit 210. A cache memory 215 may be coupled to or integrated with the processor 205 to store recently and/or frequently used instructions. The processor 205 is coupled to a bus 220 to communicate information between the processor 205 and other components in the computer system 200.

For one embodiment, the processor 205 is a microprocessor. For other embodiments, however, the processor may be a different type of processor such as, for example, a microcontroller, a digital signal processor, etc.

Also coupled to the bus 220 are one or more input devices 225, such as a keyboard and/or a cursor control device, one or more output devices 230, such as a monitor and/or printer, one or more memories 235 (e.g. random access memory (RAM), read only memory (ROM), etc.), other devices 240 (e.g. memory controller, graphics controller, bus bridge, etc.), and one or more mass storage devices and/or network connectivity devices 245.

The mass storage device(s) and/or network connectivity devices 245 may include a hard disk drive, a compact disc read only memory (CD ROM) drive, an optical disk drive and/or a network connector to couple the computer system 200 to one or more other computer systems or mass storage devices over a network, for example. Further, the mass storage device(s) 245 may include additional or alternate mass storage device(s) that are accessible by the computer system 200 over a network (not shown).

A corresponding data storage medium (or media) 250 (also referred to as a computer-accessible storage medium) may be used to store instructions, data and/or one or more programs to be executed by the processor 200. For one embodiment, the computer-accessible storage medium (or media) 250 stores information, instructions and/or programs 255–273 that, when executed by the processor 200 or another machine, are used to perform power supply noise modeling and test pattern development.

For the exemplary embodiment shown in FIG. 2, for example, an extraction engine 255 includes a power supply noise extraction engine (or extractor) 256 that identifies conditions that may result in power supply noise-related marginalities or failures. In operation, the extraction engine 255 receives layout data 257, schematic data 258, performance verification (PV) data 259 and a gate level model 260, each associated with an integrated circuit design to be analyzed. For some embodiments, as described in more detail below, the extraction engine 255 may also receive a two-dimensional power and/or thermal dissipation map 261.

Responsive to the input data, the extraction engine 255 generates a list 262 of faults and/or performance and/or functionality issues. The output of the extraction engine 255 is referred to herein as a generalized fault list or list of generalized faults 262. Each of the entries in the generalized fault list 262 may be referred to herein as a fault, although some entries may more properly be considered to be marginalities related to performance degradation, for example.

The generalized fault list 262 may indicate faults such as bridge faults, stuck-at faults, dynamic faults, etc. The generalized fault list 262 also includes entries associated with power supply droop provided by the power supply noise extractor 256 as described in more detail below.

For one embodiment, the generalized fault list 262 is provided to a ranking engine 263 that ranks the indicated faults according to selected criteria. The ranking engine 263 may be integrated with the extraction engine 255 or may be a standalone module.

The ranking engine 263 provides a ranked list of generalized faults 264 to a fault modeler 265 for one embodiment. The fault modeler 265 models the identified faults such that the fault information can be used by a fault simulator 269 to simulate the faults and by an automatic test pattern generation (ATPG) tool 267 to generate test patterns to test for the faults.

Responsive to the list of faults 264, the fault modeler 265 provides a fault list 266 at an output. The fault list 266 is provided to the ATPG tool 267 that generates test patterns 268 responsive to the fault list 266. The test patterns 268, along with the fault list 266 and the gate level model 260 are provided to the fault simulator 269. Alternatively or additionally, user-supplied test patterns 273, which may include, for example, manually written test patterns and/or patterns generated with manual assistance, may also be provided to the fault simulator 269.

The fault simulator 269 then produces a debug report 270, a coverage report 271 and statistics 272 for one embodiment. The debug report 270 may be used to access intermediate data related to the internal operations of the fault simulator to provide insight into its activity. The coverage report 271 indicates test coverage for the integrated circuit of interest using the test patterns 268 and/or 273, and the statistics 272 are generated to report on frequency of occurrence of various internal states during simulation. Such information may include signal toggle count, toggle interval, fault activation count, fault activation vectors, faulty state count, first and last fault excitation and fault propagation report.

It will be appreciated by one of ordinary skill in the art that, while FIG. 2 represents the data storage media 250 as a single block, for many embodiments, multiple data storage media may be used to store the information and/or instructions 255–272 and/or some of the information and/or instructions indicated by the blocks 255–272 may be accessible by computer system 200 over a network (not shown) or via a signal received by the computer. Further, it will be appreciated that not all of the information and/or instructions 255–272 may be included or used for all embodiments and that, for some embodiments, additional information and/or instructions may be included. Also, while the system 200 of FIG. 2 is a computer system, the system 200 may be a different type of electronic system for other embodiments.

Referring now to FIGS. 2–5, the power supply noise modeling and test pattern development approaches of exemplary embodiments are described in more detail. In the following description, reference is made to various modules and/or data shown in FIG. 2 for purposes of illustration. It will be appreciated by those of ordinary skill in the art that, for some embodiments, the actions described below may be performed using other types of modules and/or information and/or may be performed in a different manner.

Figure 3:
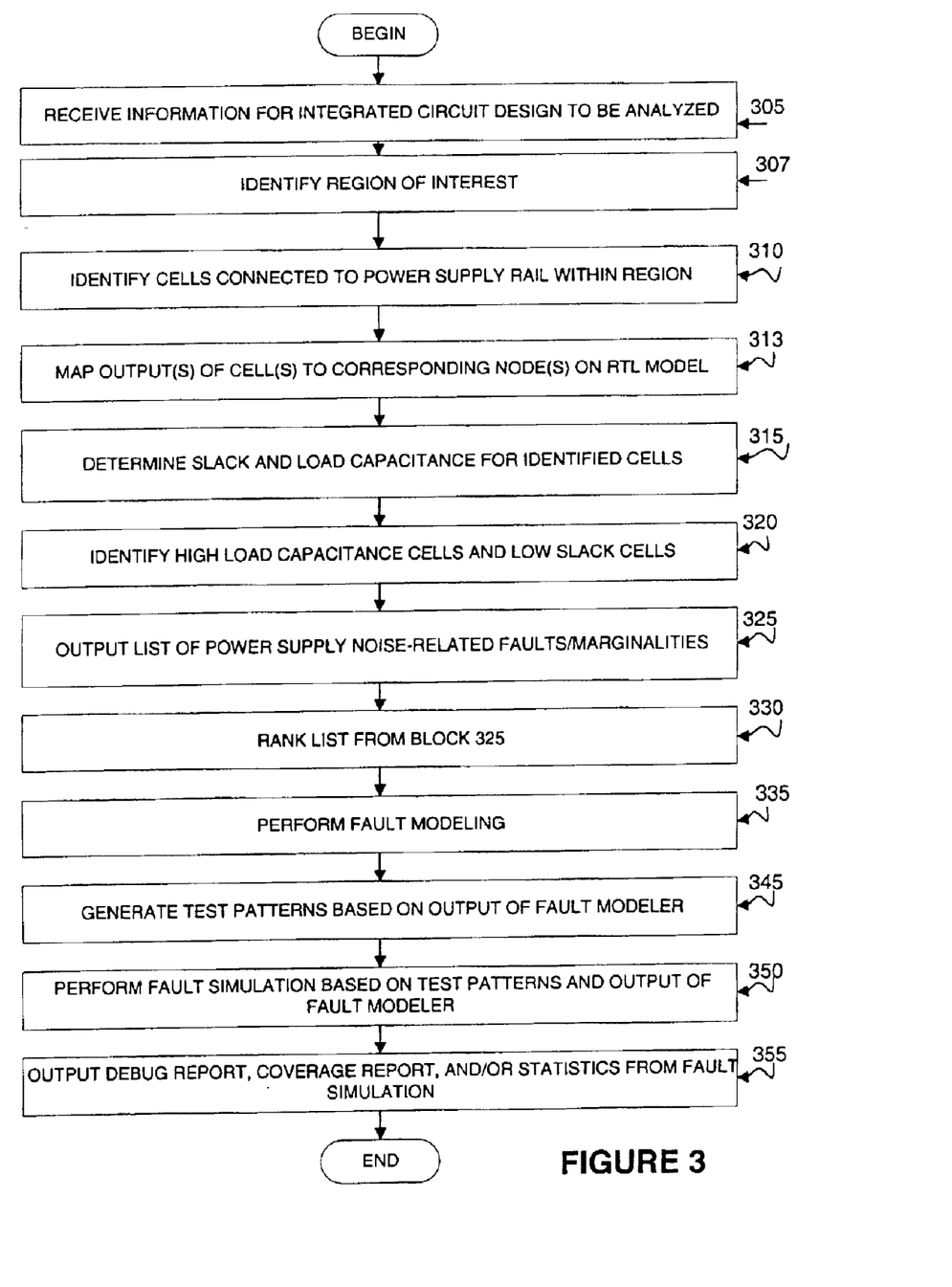
FIG. 3 is a flow diagram showing a power supply noise modeling and test pattern development method of one embodiment.

At block 305, input information associated with an integrated circuit design to be analyzed is received. For one embodiment, the input information may include one or more of layout data 257, schematic data 258, performance verification data 259, and a gate level model 260.

Figure 4:
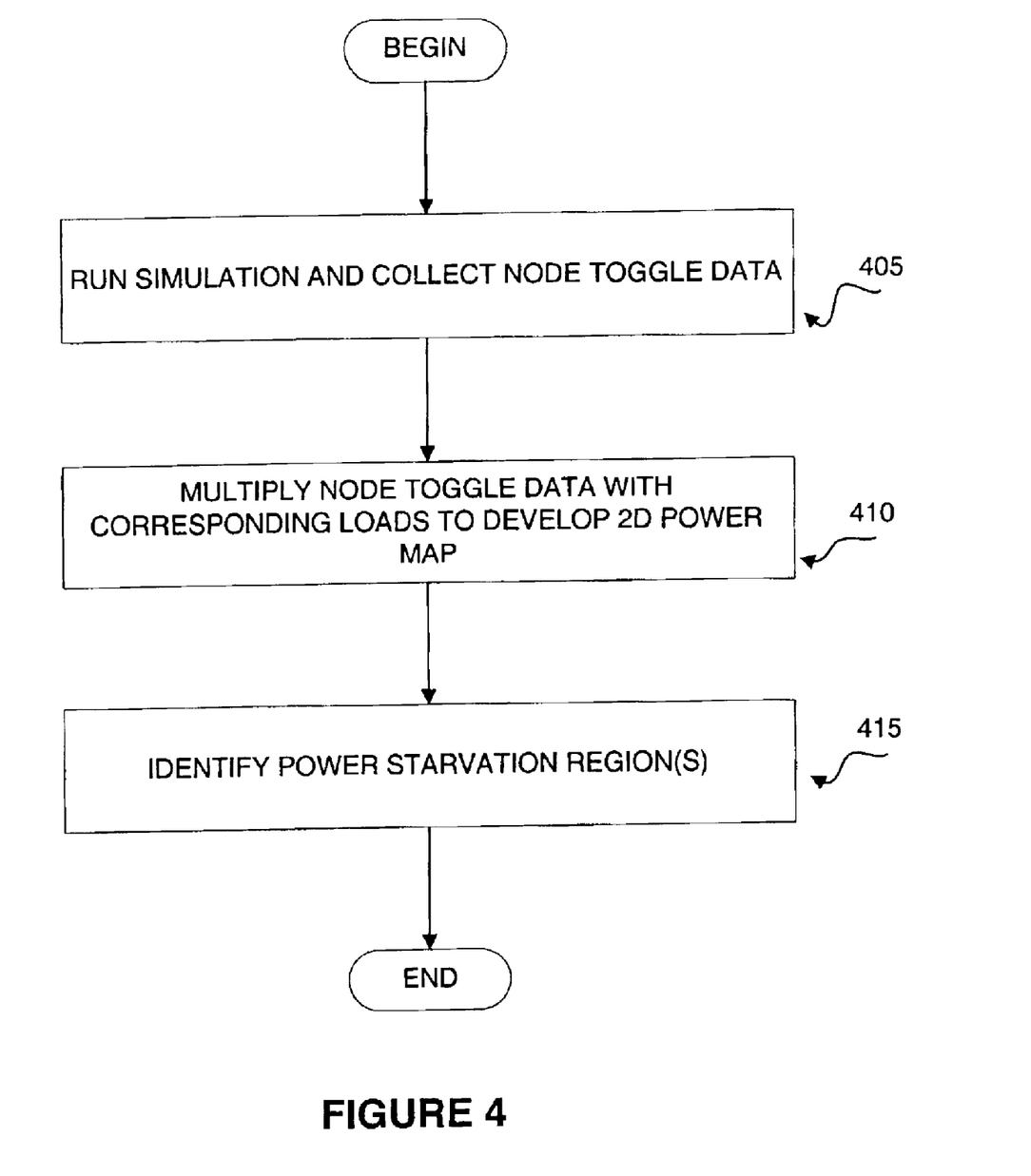
FIG. 4 is a flow diagram showing a method of one embodiment for identifying a region of interest in an integrated circuit design to be analyzed.

At block 307, a region of interest in the integrated circuit design is identified. For one embodiment, to identify a region of interest, as shown in FIG. 4, at block 405, a simulation is run and node toggle data is collected. For one embodiment, this simulation is performed by a power simulator in response to receiving user application code and/or architectural verification code. Node toggle data is then multiplied with corresponding loads to develop a two-dimensional power map 261.

From the two-dimensional power map, the power supply noise extractor 256 (or another software module) or a designer may identify one or more power starvation regions in the integrated circuit design, for example, that may be of particular interest in trying to identify potential power supply droop-related failures. Power starvation regions may include regions that are receiving relatively less power than other regions on the integrated circuit. For one embodiment, what is to be considered a power starvation region may be determined by looking specifically at the power supply rail(s) in view of the integrated circuit power requirements.

For other embodiments, the region of interest for power supply noise analysis may be user-defined based on other criteria. Limits on the size of the region to be analyzed may be determined by several factors including, for example, the interconnect density in the area of interest, the availability of memory for analysis, and other factors. For some embodiments, the region of interest may include the entire integrated circuit design.

Figure 5:
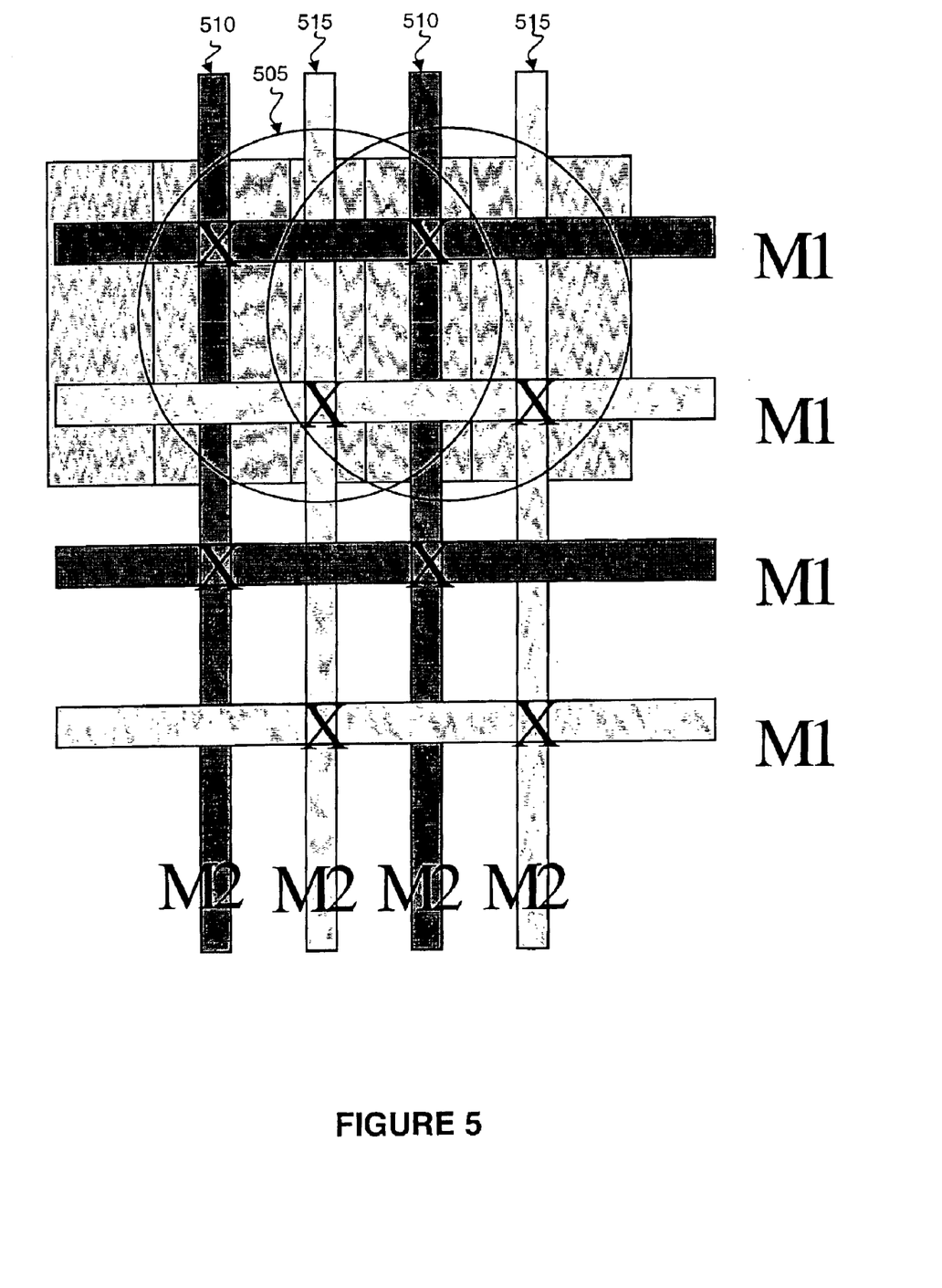
FIG. 5 is a high-level diagram illustrating a portion of an integrated circuit device, the layout of which may be analyzed using the power supply noise modeling approach of one embodiment.

An example of a region 505 to be analyzed is shown in FIG. 5. FIG. 5 is a simplified plan view of an exemplary integrated circuit layout including power supply lines 510 and ground lines 515. Once the region of interest 505 is identified, the region may be indicated in the layout or other input file associated with the integrated circuit design to be analyzed using a bounding box, for example.

Referring back to FIGS. 2–3, for some embodiments, in addition to the above input data, a two-dimensional thermal dissipation map 261 may also be received. The thermal dissipation map may be provided, for example, by a thermal modeling tool (not shown).

At block 310, cells connected to a specific power rail within the region of interest are identified. For example, referring to FIG. 5, where the region of interest is the region 505, cells within the region 505 that are connected to the power supply rail 510 are identified at block 310.

Integrated circuit designs typically include standard cells, custom logic or a mix of both. For custom logic, at block 310, the cells are identified on the basis of transistor channel connected components or CCCs. CCCs create a path from Vcc (or another power supply) to ground through the source-drain path of connected transistors. They are subclusters of transistors that may include multiple transistors.

For one embodiment, the power supply noise extractor 256, or another module, may identify cells connected to a power supply rail within the region of interest using a conventional traversal technique. For another embodiment, cells connected to the power supply rail within the region of interest may be identified using a different technique.

With continuing reference to FIGS. 2 and 3, at block 313, outputs of each of the cells identified at block 310 are mapped to a node on a corresponding RTL logic model for connectivity and observability information. By mapping the outputs of the identified cells to corresponding nodes in the RTL logic model, logical paths are provided from identified nodes to an observable port, or to a storage node that can capture an erroneous value at the sampling time and later propagate the value to a port where it can be observed or stored for later observation. In this manner, fault simulation and Automatic Test Pattern Generation (ATPG) of at least one of the gate, structural RTL and behavioral RTL model are enabled.

This mapping may be performed by the power supply noise extractor 256, or by another software module or, in some cases, manually. In performing the mapping, where a rule(s) has been applied to translate a node or cell name such that the same node or cell has a different name in the RTL model versus the layout, an inverse of the rule may be applied to identify the associated node.

For another embodiment, this action may be performed at a different point in the method (e.g. after block 320), and/or may only be performed for a subset of the cells identified at block 310 (e.g. only for low slack and/or high load capacitance cells described below).

At block 315, for the cells identified at block 310, the associated slack and load capacitance is determined. For one embodiment, the slack, or transition delay margin, for each cell may be determined from the performance verification data 259, while the load capacitance may be determined from the performance verification data and/or the details of the physical design (e.g. the schematic data), for example.

At block 320, high load capacitance cells and low slack cells are identified. For one embodiment, identifying high load capacitance cells and low slack cells includes ranking the cells in terms of slack and/or load capacitance.

For one embodiment low slack cells are those cells having a slack below a predetermined value that may, for example, be user-defined and high load capacitance cells are cells having a load capacitance above a predetermined value that may also be user-defined.

Alternatively, high load capacitance cells may be defined as those cells having a load capacitance equal to or above a user-defined percentage of total capacitive load in the region of interest, also referred to as the window of analysis, and low slack cells may be defined as those cells having a slack equal to or below a user-defined percentage of the overall cycle time.

For still another embodiment, low slack cells and high load capacitance cells may be defined in a different manner. For example, cells that are to be considered low slack may be a predetermined number X of cells with the lowest slack while a predetermined number Y of cells with the highest load capacitance may be deemed to be high load capacitance cells for the purposes of block 320.

In many cases, the distribution of slack and load capacitance for identified cells is such that relatively distinct dividing lines can be drawn between high load capacitance and low load capacitance and between low slack and high slack. Thus, another approach may include identifying the difference in slack/load capacitance for each entry in the ranked list of cells and determining the demarcation between high and low slack/load capacitance based on these differences.

Further, for some embodiments, combinations of cells that, together, have a high load capacitance and/or low slack according to one or more of the above criteria may also be identified at block 320.

It will be appreciated that either or both of the absolute capacitive load or the effective capacitive load may be provided for each cell.

At block 325, based on the determinations at block 320, a list of potential power supply noise-related failures, faults and/or marginalities is provided. The list of faults may indicate, for example, a set of excitation condition(s) that causes a particular cell or cells to have a negative slack. The excitation conditions in this case, may be in the form of one (or more) of the high load capacitance cells identified at block 320, that, when (concurrently) switched, may cause one or more of the low slack cells to have a marginal or negative slack. For one embodiment, this list of faults is provided as an output from the power supply noise extractor 256.

At block 330, the faults provided at block 325 may be ranked. Where the output of block 325 is provided in ranked order, this action may not be necessary for the identified power supply noise-related faults. Where a fault list includes faults from multiple sources (i.e. other sources in addition to the power supply noise extractor), however, it may be desirable to rank the fault list.

For one embodiment, the faults are ranked by a ranking engine 263, which, as described above, may or may not be integrated with the power supply noise extractor 256. The faults may be ranked based on any variety of criteria. For one embodiment, the power supply noise-related faults are ranked in terms of the slack or transition delay for the associated cell either alone or as a percentage of overall delay. Other approaches such as determining the downstream impact of the fault, whether the fault is in a critical path, etc. may be used to rank faults.

At block 335, the ranked list of faults is provided to a fault modeler to model the faults such that they can be simulated and corresponding test patterns may be generated. For one embodiment, the fault modeler 265 is a commercially available fault modeler. For another embodiment, the fault modeler 265 is a generalized fault modeler in accordance with U.S. patent application Ser. No. 10/256,678, entitled, "METHOD AND APPARATUS FOR GENERALIZED FAULT MODELING,".

At block 345, a fault list from the fault modeler is provided to an ATPG tool in a form that is usable by the ATPG tool to generate associated test patterns based on the extracted power supply noise-related faults and/or marginalities detected at blocks 320 and 325 and/or other faults and/or marginalities from other sources. The ATPG tool may be any ATPG tool, such as a commercially available ATPG tool or a custom ATPG tool. Where the fault list is provided by a fault modeler 265 in accordance with the above-referenced patent application, the fault list may be in the form of excitation conditions and associated impact, for example (e.g. high load capacitance cells and low slack cells in the region of interest for power supply noise-related faults).

For another embodiment, the actions associated with block 345 may instead be performed manually or with manual assistance.

At block 350, the resulting test patterns, and/or test patterns from any other source, and the fault list from block 340 are provided to a fault simulator along with a gate level model of the associated integrated circuit chip. The fault simulator, like the ATPG tool, may be any type of fault simulator, such as a commercially available fault simulator or a custom fault simulator.

At block 355, one or more of a debug report, a coverage report and statistics are provided as a result of the fault simulation. This information may be used to determine which of the test patterns produced at block 345 are to be used during testing, for example, and/or to determine whether additional test patterns should be generated.

It will be appreciated that, for other embodiments, some of the abovedescribed actions may not be performed and/or additional actions may be performed. Further, for some embodiments, some of the above-described actions may be performed concurrently or in a different order.

Using the above-described approach, the conditions (e.g. data values and instructions) that cause power supply noise-related failures and/or marginalities may be identified, such that corresponding test patterns may be developed to excite the worst case noise for a power supply rail. For one embodiment, this is accomplished, as described above, by mapping information pertaining to load and slack to corresponding behavior as a logic fault model to input to a fault simulator or an ATPG tool. The ability to model and identify such faults enables power supply noise-related failures and marginalities in an integrated circuit design to be more easily identified. In some cases, the output of this approach may even be used to change the power design to, for example, widen power supply lines in particularly congested areas or make other types of adjustments.

In the foregoing specification, the invention has been described with reference to specific exemplary embodiments thereof. It will, however, be appreciated that various modifications and changes may be made thereto without departing from the broader spirit and scope of the invention as set forth in the appended claims. For example, for some embodiments, a dynamic simulation (e.g. SPICE) may be performed to determine the estimated delay impact of concurrently switching high load capacitance cells to identify potential faults. Other approaches for identifying potential power supply noise-related faults are within the scope of various embodiments. The specification and drawings are, accordingly, to be regarded in an illustrative rather than a restrictive sense.

What is claimed is:

1. A method comprising:
   fault modeling, in response to receiving input data related to an integrated circuit design, potential power supply noise-related faults, and
   ranking the faults modeled.

2. The method of claim 1 wherein fault modeling includes
   identifying from the integrated circuit design, one or more cells that are connected to a first power supply rail within a first region;
   determining slack and load capacitance associated with each identified cell; and
   identifying the potential power supply noise-related faults based, at least in part, on the slack of the identified cells.

3. The method of claim 2 further comprising:
   mapping the outputs of the identified cells to nodes in a corresponding Register Transfer Level (RTL) model.

4. The method of claim 2 further comprising:
   identifying faults in response to identifying low slack cells and high load capacitance cells; and
   ranking the identified faults.

5. The method of claim 4 wherein
   identifying low slack cells and high load capacitance cells includes ranking the cells that are connected to the first power supply rail in terms of slack and load capacitance.

6. The method of claim 5 wherein
   identifying low slack cells and high load capacitance cells further includes identifying at least one of low slack cells and high load capacitance cells according to user-defined criteria.

7. The method of claim 2 further comprising:
   representing the load capacitance and slack associated with faults in a logic fault model to be input to at least one of a fault simulator and an automatic test pattern generation (ATPG) tool.

8. The method of claim 2 further comprising:
   identifying the first region in response to receiving a power map.

9. The method of claim 8 wherein
   identifying the first region comprises identifying at least a first power starvation region using the power map.

10. An apparatus comprising:
    a power supply noise extractor to identify, in response to receiving input data related to an integrated circuit design, potential power supply noise-related faults, and
    a ranking engine to rank the identified faults.

11. The apparatus of claim 10, wherein
    the power supply noise extractor is to identify power supply noise-related faults in a first region, the first region being identified based on a power map.

12. The apparatus of claim 10, wherein
    the power supply noise extractor is to identify power supply noise-related faults in response to receiving slack and load capacitance information for each cell in a first region of the integrated circuit design that is connected to a first power supply rail.

13. The apparatus of claim 12, wherein
    the power supply noise extractor is to identify the cells in the first region that have a low slack and cells in the first region that have a high load capacitance.

14. The apparatus of claim 13, wherein
    the power supply noise extractor is to map an output of at least one of the cells in the first region that is connected to the first power supply rail to a corresponding node in a Register Transfer Level (RTL) model.

15. The apparatus of claim 10, wherein
    the ranking engine is further to provide the ranked faults to an automatic test pattern generation (ATPG) tool to generate associated test patterns.

16. The apparatus of claim 15, wherein
    the ranking engine is to rank the identified power supply noise-related faults in terms of slack.

17. An article of manufacture comprising:
    a machine-accessible medium storing data that, when accessed by a machine, cause the machine to,
    identify, in response to receiving data associated with an integrated circuit design, potential power supply noise-related faults, and
    rank the identified faults.

18. The article of manufacture of claim 17, wherein
    the machine-accessible medium further stores data that, when accessed by the machine, cause the machine to,
    identify the power supply noise-related faults based, at least in part, on the slack of cells coupled to a first power supply rail within a first region.

19. The article of manufacture of claim 18, wherein the machine-accessible medium further stores data that, when accessed by the machine, cause the machine to, identify the first region based on a power supply map.

20. The article of manufacture of claim 18, wherein the machine-accessible medium further stores data that, when accessed by the machine, cause the machine to, identify the slack and load capacitance of each cell coupled to the power supply rail within the first region, and
rank the cells in terms of at least one of slack and load capacitance.

21. The article of manufacture of claim 20, wherein the machine-accessible medium further stores data that, when accessed by the machine, cause the machine to, identify high load capacitance cells and low slack cells.

22. A method comprising:
identifying from a power map associated with an integrated circuit design, a power starvation region and corresponding power supply rail,
identifying cells in the integrated circuit design within the power starvation region that are connected to the power supply rail,
receiving slack and load capacitance data associated with the identified cells, and
ranking the identified cells in terms of at least one of slack and load capacitance.

23. The method of claim 22 further comprising:
identifying high load capacitance cells and low slack cells.

24. The method of claim 23 further comprising:
generating a power supply noise-related fault list in response to identifying the high load capacitance cells and low slack cells.

25. The method of claim 22 wherein
identifying high load capacitance cells and low slack cells includes applying a user-defined criterion to the ranked, identified cells.

* * * * *